United States Patent
Doi et al.

(10) Patent No.: US 10,703,935 B2
(45) Date of Patent: Jul. 7, 2020

(54) POLISHING COMPOSITION FOR SILICON OXIDE FILM

(71) Applicant: Kao Corporation, Tokyo (JP)

(72) Inventors: Haruhiko Doi, Wakayama (JP); Koji Kinuta, Wakayama (JP)

(73) Assignee: KAO CORPORATION, Tokyo (JP)

( * ) Notice: Subject to any disclaimer, the term of this patent is extended or adjusted under 35 U.S.C. 154(b) by 0 days.

(21) Appl. No.: 15/511,878

(22) PCT Filed: Sep. 25, 2015

(86) PCT No.: PCT/JP2015/077030
§ 371 (c)(1),
(2) Date: Mar. 16, 2017

(87) PCT Pub. No.: WO2016/047725
PCT Pub. Date: Mar. 31, 2016

(65) Prior Publication Data
US 2017/0292038 A1    Oct. 12, 2017

(30) Foreign Application Priority Data
Sep. 26, 2014    (JP) .................................. 2014-197458

(51) Int. Cl.
*C09G 1/02*    (2006.01)
*B24B 37/04*    (2012.01)
*H01L 21/3105*    (2006.01)
*C09K 3/14*    (2006.01)

(52) U.S. Cl.
CPC .............. *C09G 1/02* (2013.01); *B24B 37/044* (2013.01); *C09K 3/1409* (2013.01); *C09K 3/1463* (2013.01); *H01L 21/31053* (2013.01)

(58) Field of Classification Search
CPC ... C09G 1/02; B24B 37/044; H01L 21/31053; C09K 3/1409; C09K 3/1463
See application file for complete search history.

(56) References Cited

U.S. PATENT DOCUMENTS

| | | | | |
|---|---|---|---|---|
| 6,423,125 | B1 * | 7/2002 | Ishibashi | C09G 1/02 106/3 |
| 6,436,835 | B1 * | 8/2002 | Kido | C09K 3/1463 257/E21.244 |
| 2002/0098697 | A1 * | 7/2002 | Shimazu | C09G 1/02 438/691 |
| 2004/0152309 | A1 | 8/2004 | Carter et al. | |
| 2005/0076581 | A1 | 4/2005 | Small et al. | |
| 2005/0221726 | A1 | 10/2005 | Honma et al. | |
| 2006/0196848 | A1 | 9/2006 | Carter et al. | |
| 2007/0218811 | A1 | 9/2007 | Kurata et al. | |
| 2009/0325323 | A1 * | 12/2009 | Ueno | B24B 37/044 438/10 |
| 2010/0176335 | A1 | 7/2010 | Kim et al. | |
| 2011/0165824 | A1 * | 7/2011 | Saito | C03C 15/00 451/41 |
| 2014/0014872 | A1 | 1/2014 | Tamada et al. | |

FOREIGN PATENT DOCUMENTS

| | | | | |
|---|---|---|---|---|
| JP | 10-106987 A | | 4/1998 | |
| JP | 2001-7060 A | | 1/2001 | |
| JP | 2005-23313 A | | 1/2005 | |
| JP | WO 2005/000984 | * | 6/2005 | .............. C09G 1/02 |
| JP | 2005-319573 A | | 11/2005 | |
| JP | 2006-520530 A | | 9/2006 | |
| JP | 2010-529672 A | | 8/2010 | |
| JP | 2011-181946 A | | 9/2011 | |
| JP | 2012-212723 A | | 11/2012 | |
| JP | 2014-141667 A | | 8/2014 | |
| WO | WO 2005/123864 A1 | | 12/2005 | |

OTHER PUBLICATIONS

Examiner Hand Calculations (2018)(2 pages).*
International Search Report issued in PCT/JP2015/077030 (PCT/ISA/210), dated Dec. 15, 2015.

* cited by examiner

*Primary Examiner* — Nadine G Norton
*Assistant Examiner* — Mahmoud Dahimene
(74) *Attorney, Agent, or Firm* — Birch, Stewart, Kolasch & Birch, LLP

(57) ABSTRACT

Provided is a polishing composition for a silicon oxide film that can improve the speed of polishing a silicon oxide film. In one or more embodiments, a polishing composition for a silicon oxide film contains: water; a cerium oxide particle; and a compound having in its molecule an amino group and at least one acid group selected from a sulfonic acid group and a phosphonic acid group. In the polishing composition, [the number of moles of the acid group contained in the compound]/[total surface area of the cerium oxide particle] is in a range from $1.6 \times 10^{-5}$ mol/m$^2$ to $5.0 \times 10^{-2}$ mol/m$^2$.

6 Claims, No Drawings

POLISHING COMPOSITION FOR SILICON OXIDE FILM

TECHNICAL FIELD

The present disclosure relates to a polishing composition for a silicon oxide film, and a method for producing a semiconductor substrate using the same.

BACKGROUND ART

CMP (chemical mechanical polishing) is a technique of planarizing surfaces by bringing a processing surface of a substrate to be polished into contact with a polishing pad, supplying a polishing liquid to a contact portion therebetween, and moving them relatively, thereby allowing uneven portions on the surface of the substrate to be reacted chemically and removed mechanically.

Patent Document 1 discloses, as a polishing agent for forming a shallow trench isolation structure, a CMP polishing agent that includes: a cerium oxide particle; a dispersant; a water-soluble organic low-molecule additive having an anionic group selected from a free —COOM group, a phenolic OH group, a —SO$_3$M group, an —OSO$_3$H group, a —PO$_4$M$_2$ group, and a —PO$_3$M$_2$ group (wherein M is H, NH$_4$, or a metal atom such as Na or K); and water.

PRIOR ART DOCUMENT

Patent Document

Patent Document 1: JP 2001-007060 A

DISCLOSURE OF INVENTION

Problem to be Solved by the Invention

In the CMP, improving the polishing speed with respect to a film to be polished, for example, a silicon oxide film, is one of the challenges to be solved. Therefore, in one or more embodiments, the present disclosure provides a polishing composition for a silicon oxide film that can improve the polishing speed.

Means for Solving Problem

In one or more embodiments, the present disclosure relates to a polishing composition for a silicon oxide film (hereinafter, also referred to as "polishing composition of the present disclosure"), containing: water; a cerium oxide particle; and a compound having in its molecule an amino group and at least one acid group selected from a sulfonic acid group and a phosphonic acid group. A ratio of the number of moles of the acid group contained in the compound to a total surface area of the cerium oxide particle ([the number of moles of the acid group contained in the compound]/[total surface area of the cerium oxide particle]) is in a range from $1.6\times10^{-5}$ mol/m$^2$ to $5.0\times10^{-2}$ mol/m$^2$.

In another one or more embodiments, the present disclosure relates to a use of a composition in polishing a silicon oxide film, the composition containing: water; a cerium oxide particle; and a compound having in its molecule an amino group and at least one acid group selected from a sulfonic acid group and a phosphonic acid group. A ratio of the number of moles of the acid group contained in the compound to a total surface area of the cerium oxide particle ([the number of moles of the acid group contained in the compound]/[total surface area of the cerium oxide particle]) is in a range from $1.6\times10^{-5}$ mol/m$^2$ to $5.0\times10^{-2}$ mol/m$^2$.

In another one or more embodiments, the present disclosure relates to a method for producing a semiconductor substrate, including polishing a silicon oxide film using the polishing composition of the present disclosure.

In another one or more embodiments, the present disclosure relates to a method for polishing a semiconductor substrate, including polishing a silicon oxide film using the polishing composition of the present disclosure.

Effects of the Invention

In one or more embodiments, the polishing composition of the present disclosure can provide an effect of improving the polishing speed with respect to a silicon oxide film.

DESCRIPTION OF THE INVENTION

The present disclosure is based on the finding that a polishing composition including a cerium oxide particle (hereinafter, also referred to as a ceria particle) as an abrasive grain can improve the polishing speed for a silicon oxide film when it contains a compound having an amino group and a sulfonic and/or phosphonic acid group in its molecule. In one or more embodiments, colloidal ceria to be used as a ceria particle can reduce colloidal flaws (the number of scratches) after polishing.

The precise mechanism that can improve the polishing speed for a silicon oxide film in the polishing composition of the present disclosure is still not fully understood, but it is assumed as follows. Specifically, it is found that a compound having an amino group and a sulfonic and/or phosphonic acid group in its molecule adsorbs on the surface of a ceria particle in a multilayer state. Since the surface potential of a silicon oxide film is generally negative, a ceria particle having a positive surface potential has a higher polishing speed than a ceria particle having a negative surface potential. Further, the compound having an amino group and a sulfonic and/or phosphonic acid group in its molecule adsorbs on the positively charged surface of a ceria particle in a multilayer state, thereby promoting the spread of the positive charge, causing the ceria particle to be easily attracted to a substrate, and improving the polishing speed. Note that these are only assumptions, and the present disclosure is not limited to these mechanisms.

[Compound Having Amino Group and Sulfonic and/or Phosphonic Acid Group in its Molecule]

In the present disclosure, in one or more embodiments, a compound having an amino group and at least one selected from a sulfonic acid group and a phosphonic acid group in its molecule (hereinafter, also referred to as "amphoteric compound" simply) is an amphoteric compound that can adsorb on a ceria particle, and from the viewpoint of improving the polishing speed, it is a compound that can adsorb on a ceria particle in a multilayer state. In the present disclosure, in one or more embodiments, multilayer adsorption refers to a phenomenon in which the adsorption amount of the compound increases in correlation with the addition amount of the compound, to the extent that is beyond the adsorption amount of the compound expected for monolayer adsorption.

In one or more embodiments, examples of an amphoteric compound having an amino group and a sulfonic acid group in its molecule include sulfamic acid, taurine and derivatives thereof, and sulfamic acid is preferred, from the viewpoint of improving the polishing speed. In one or more embodiments, an example of an amphoteric compound having an amino group and a phosphonic acid group in its molecule is aminomethylphosphonic acid from the same viewpoint.

In one or more embodiments, the content of the amphoteric compound in the polishing composition of the present disclosure is preferably 0.001 mass % or more, more preferably 0.005 mass % or more, further preferably 0.01 mass % or more, and still further preferably 0.05 mass % or more from the viewpoint of improving the polishing speed. In one or more embodiments, the content of the amphoteric compound in the polishing composition of the present disclosure is preferably 0.50 mass % or less, more preferably 0.30 mass % or less, and further preferably 0.15 mass % or less from the same viewpoint. In one or more embodiments, the content of the amphoteric compound in the polishing composition of the present disclosure is preferably 0.001 to 0.50 mass %, more preferably 0.005 to 0.30 mass %, further preferably 0.01 to 0.15 mass %, and still further preferably 0.05 to 0.15 mass % from the viewpoint of improving the polishing speed.

[Ceria (Cerium Oxide) Particle]

The polishing composition of the present disclosure contains a ceria particle as a polishing abrasive grain. In one or more embodiments, examples of the ceria particle include colloidal ceria, and baked pulverized ceria. The ceria particle is preferably colloidal ceria from the viewpoint of reducing polishing flaws after polishing. The ceria particle is preferably baked pulverized ceria from the viewpoint of improving the polishing speed. The polishing composition of the present disclosure may contain a hydroxide of cerium.

The ceria particle preferably has a substantially spherical shape. The average primary particle diameter of the ceria particle to be used is preferably 15 nm or more, more preferably 20 nm or more, further preferably 40 nm or more, still further preferably 50 nm or more, and preferably 300 nm or less, more preferably 200 nm or less, further preferably 150 nm or less, and still further preferably 100 nm or less from the viewpoint of the polishing speed. Ceria particle having an average primary particle diameter of 15 nm or more can effectively improve the polishing speed for a silicon oxide film, and that having an average primary particle diameter of 300 nm or less can effectively prevent the occurrence of polishing flaws. In the present disclosure, the average primary particle diameter of the ceria particle is calculated using a specific surface area S ($m^2/g$) calculated by a BET (nitrogen adsorption) method. The specific surface area can be measured by, for example, a method described in the examples. In the present disclosure, an average primary particle diameter calculated by the BET method is also called "BET equivalent particle diameter".

[The Number of Acid Group in Compound/Total Surface Area of Particle]

In the polishing composition of the present disclosure, in one or more embodiments, the ratio of the number of moles of the acid groups (sulfonic acid group and phosphonic acid group) contained in the amphoteric compound to the total surface area of the ceria particle ([the number of moles of a sulfonic acid group and a phosphonic acid group]/[total surface area of the cerium oxide particle]) is preferably $1.6 \times 10^{-5}$ mol/$m^2$ or more, more preferably $5.1 \times 10^{-5}$ mol/$m^2$ or more, further preferably $8.4 \times 10^{-5}$ mol/$m^2$ or more, and still further preferably $1.6 \times 10^{-4}$ mol/$m^2$ or more from the viewpoint of improving the polishing speed. In one or more embodiments, the ratio is preferably $5.0 \times 10^{-2}$ mol/$m^2$ or less, more preferably $1.4 \times 10^{-3}$ mol/$m^2$ or less, further preferably $8.6 \times 10^{-4}$ mol/$m^2$ or less, and still further preferably $5.2 \times 10^{-4}$ mol/$m^2$ or less from the same viewpoint. The ratio is preferably in a range from $1.6 \times 10^{-5}$ mol/$m^2$ to $5.0 \times 10^{-2}$ mol/$m^2$, more preferably in a range from $5.1 \times 10^{-5}$ mol/$m^2$ to $1.4 \times 10^{-3}$ mol/$m^2$, further preferably in a range from $8.4 \times 10^{-5}$ mol/$m^2$ to $8.6 \times 10^{-4}$ mol/$m^2$, and still further preferably in a range from $1.6 \times 10^{-4}$ mol/$m^2$ to $5.2 \times 10^{-4}$ mol/$m^2$ from the same viewpoint. In the present disclosure, the total surface area of the ceria particle can be determined by multiplying a specific surface area S ($m^2/g$) calculated by the BET (nitrogen adsorption) method by the content of the ceria particle in the polishing composition of the present disclosure.

[Content of Ceria Particle]

In one or more embodiments, the content of the ceria particle in the polishing composition of the present disclosure is preferably 0.001 mass % or more, more preferably 0.01 mass % or more, further preferably 0.05 mass % or more, and still further preferably 0.1 mass % or more from the viewpoint of improving the polishing speed. In one or more embodiments, the content of the ceria particle in the polishing composition of the present disclosure is preferably 1.0 mass % or less, more preferably 0.80 mass % or less, further preferably 0.60 mass % or less, and still further preferably 0.5 mass % or less from the same viewpoint. In one or more embodiments, the content of the ceria particle in the polishing composition of the present disclosure is preferably 0.001 to 1.0 mass %, more preferably 0.01 to 0.80 mass %, further preferably 0.05 to 0.60 mass %, and still further preferably 0.1 to 0.5 mass % from the same viewpoint.

[Water]

The polishing composition of the present disclosure contains water as an aqueous medium. The water is preferably ion exchanged water, distilled water, or ultrapure water from the viewpoint of improving the quality of a semiconductor substrate. The content of the water in the polishing composition of the present disclosure can be a remainder of the polishing composition after subtracting the amphoteric compound and the ceria particle when the total mass of the amphoteric compound, the ceria particle, and water is assumed to be 100 mass %.

[pH]

The pH of the polishing composition of the present disclosure is preferably more than 2.5, more preferably 3.0 or more, further preferably 3.5 or more, and still further preferably 4.0 or more from the viewpoint of improving the polishing speed and polishing selectivity. The pH is preferably 8.0 or less, more preferably 7.5 or less, and further preferably 7.0 or less from the same viewpoint. The pH is preferably more than 2.5 and 8.0 or less, more preferably 3.0 to 8.0, further preferably 3.5 to 7.5, and still further preferably 4.0 to 7.0 from the same viewpoint. The pH of the polishing composition in the present disclosure is a value thereof at 25° C. measured using a pH meter. The pH of the polishing composition of the present disclosure can be specifically measured by a method described in the examples.

An acid or a base can be used as needed for adjusting the pH of the polishing composition of the present disclosure. In one or more embodiments, examples of the acid include, but are not particularly limited to, inorganic acids such as hydrochloric acid, nitric acid and sulfuric acid, and organic acids such as acetic acid, oxalic acid, citric acid and malic acid. Among these, the acid is preferably at least one selected from hydrochloric acid, nitric acid and acetic acid, and more preferably at least one selected from hydrochloric acid and acetic acid, from the viewpoint of versatility. In one or more embodiments, examples of the base include, but are not particularly limited to, inorganic alkali compounds such as ammonia and potassium hydroxide, and organic alkali compounds such as alkylamine and alkanolamine. Among these, the base is preferably at least one selected from ammonia and alkylamine, and more preferably ammonia, from the viewpoint of improving the quality of a semiconductor substrate.

[Other Components]

The polishing composition of the present disclosure may contain optional components such as a polishing aid in addition to the above-described components in a range that does not hinder the effect of improving the polishing speed. The content of the optional components is preferably 0.001 mass % or more, more preferably 0.0025 mass % or more, and further preferably 0.01 mass % or more from the viewpoint of the polishing speed for a silicon oxide film, and preferably 1 mass % or less, more preferably 0.5 mass % or less, and further preferably 0.1 mass % or less from the viewpoint of improving polishing selectivity.

[Preparation of Polishing Composition]

In one or more embodiments, the polishing composition of the present disclosure can be produced by a method that includes a step of mixing the amphoteric compound, the ceria particle, and water.

In one or more embodiments, the polishing composition of the present disclosure is not limited to a so-called one-pack type that is put on the market in a state in which all the components are mixed beforehand, but can be a so-called two-pack type that is mixed when used. In one or more embodiments, a two-pack type polishing composition is separated into a first liquid and a second liquid. For example, the polishing composition may be composed of a first liquid in which the ceria particle is mixed in water and a second liquid in which the amphoteric compound is dissolved in water, and the first liquid and the second liquid are mixed later. The first liquid and the second liquid may be mixed before being supplied to the surface of an object to be polished (substrate to be polished), or they may be separately supplied to the surface of a substrate to be polished and mixed thereon.

Although the above content of each component is applied to the polishing composition in use in the polishing step, the polishing composition of the present disclosure may be preserved and provided in the form of a concentrate as long as its stability is not impaired. This is preferred because the production and transportation costs can be reduced. The concentrate of the polishing composition of the present disclosure can be diluted appropriately with the above aqueous medium as needed so as to be used in the polishing step. The dilution ratio is preferably 5 to 100 times.

[Production Method of Semiconductor Substrate]

The polishing composition of the present disclosure can be used suitably in the polishing carried out in a step of forming an element isolation structure of a semiconductor substrate. In one or more embodiments in the production method of the semiconductor substrate of the present disclosure, first, a silicon substrate is exposed to oxygen in an oxidation furnace so as to grow a silicon dioxide layer on its surface, and a silicon nitride ($Si_3N_4$) film is formed, e.g., by a CVD (chemical vapor deposition) method on the silicon dioxide layer. Next, a trench is formed by a photolithography technique on a substrate including the silicon substrate and the silicon nitride film arranged on one of principal surfaces of the silicon substrate, e.g., on a substrate in which a silicon nitride film is formed on a silicon dioxide layer of a silicon substrate. Next, a silicon oxide ($SiO_2$) film for covering the trench is formed, e.g., by a CVD method using a silane gas and an oxygen gas. Thus, a substrate to be polished in which the silicon nitride film is covered by the silicon oxide film is obtained. By forming the silicon oxide film, the trench is filled with silicon oxide of the silicon oxide film, and the surface of the silicon nitride film that is opposite to the surface facing the silicon substrate side is covered by the silicon oxide film. The surface of the silicon oxide film thus formed that is opposite to the surface facing the silicon substrate side has a difference in height formed correspondingly to the convexo-concave pattern of the lower layer. The silicon oxide film is polished by the CMP method until at least the surface of the silicon nitride film that is opposite to the surface facing the silicon substrate side is exposed, more preferably until its surface is flush with the surface of the silicon nitride film. The polishing composition of the present disclosure is used in the polishing step by this CMP method.

In another one or more embodiments in the production method of the semiconductor substrate of the present disclosure, first, a silicon substrate is exposed to oxygen in an oxidation furnace so as to grow a silicon dioxide layer on its surface, and a polysilicon (Poly-Si) film is formed, e.g., by a CVD (chemical vapor deposition) method on the silicon dioxide layer. Next, a trench is formed by a photolithography technique on the substrate. Next, a silicon oxide ($SiO_2$) film for covering the trench is formed by a CVD method using a silane gas and an oxygen gas. Thus, a substrate to be polished in which the polysilicon film is covered by the silicon oxide film is obtained. By forming the silicon oxide film, the trench is filled with silicon oxide of the silicon oxide film, and the surface of the polysilicon film that is opposite to the surface facing the silicon substrate side is covered by the silicon oxide film. The surface of the silicon oxide film thus formed that is opposite to the surface facing the silicon substrate side has a difference in height formed correspondingly to the convexo-concave pattern of the lower layer. The silicon oxide film is polished by the CMP method until at least the surface of the polysilicon film that is opposite to the surface facing the silicon substrate side is exposed, more preferably until its surface is flush with the surface of the polysilicon film. The polishing composition of the present disclosure is used in the polishing step by this CMP method.

In the polishing by the CMP method, uneven portions on the surface of a substrate to be polished are planarized by supplying the polishing composition of the present disclosure to a contact portion between the substrate to be polished and a polishing pad in a state where the surface of the substrate to be polished and the polishing pad are in contact with each other, and moving them relatively. In the production method of the semiconductor substrate of the present disclosure, another insulating film may be formed between the silicon dioxide layer of the silicon substrate and the silicon nitride film, and another insulating film may be formed between the silicon oxide film and the silicon nitride film.

The number of revolutions of the polishing pad is preferably 30 to 200 r/min, more preferably 45 to 150 r/min, and further preferably 60 to 100 r/min, regardless of whether the polishing composition of the present disclosure is a one-pack type or two-pack type. The number of revolutions of the substrate to be polished is preferably 130 to 200 r/min, more preferably 45 to 150 r/min, and further preferably 60 to 100 r/min.

The polishing load of a polishing device equipped with a polishing pad is preferably 500 g weight/$cm^2$ or less, more preferably 400 g weight/$cm^2$ or less, and further preferably 350 g weight/cm² or less, regardless of whether the polishing composition is a one-pack type or two-pack type, from the viewpoint of preventing an adverse effect on planarization and an occurrence of flaws due to an excessive load. Meanwhile, the polishing load is preferably 20 g weight/cm² or more, more preferably 50 g weight/cm² or more, and further preferably 100 g weight/cm² or more, from the viewpoint of shortening the polishing time. The polishing load in the present disclosure is the pressure of a platen to be applied to the polishing surface of a substrate to be polished during polishing.

The supply speed of the polishing composition of the present disclosure is preferably 500 mL/min or less, more preferably 400 mL/min or less, and further preferably 300 mL/min or less from the viewpoint of efficient polishing. Meanwhile, the supply speed of the polishing composition is preferably 10 mL/min or more, and more preferably 30 mL/min or more from the viewpoint of improving the polishing speed for a silicon oxide film.

[Polishing Method]

In another aspect, the present disclosure relates to a method for polishing a semiconductor substrate (hereinafter, also referred to as a polishing method of the present disclosure), including polishing a silicon oxide film using the above-described polishing composition of the present disclosure. The specific polishing method and polishing conditions can be the same as those described in the above production method of the semiconductor substrate of the present disclosure. The polishing method of the present disclosure can provide the effect of improving the polishing speed with respect to a silicon oxide film.

Regarding the above-described embodiments, the present invention further discloses the following compositions, production methods, or uses thereof.

<A1> A polishing composition for a silicon oxide film, containing:
water;
a cerium oxide particle; and
a compound having an amino group and a sulfonic and/or phosphonic acid group in its molecule.

<A2> The polishing composition according to <A1>, wherein a content of the compound in the polishing composition is preferably 0.001 mass % or more, more preferably 0.005 mass % or more, further preferably 0.01 mass % or more, and still further preferably 0.05 mass % or more.

<A3> The polishing composition according to <A1> or <A2>, wherein a content of the compound in the polishing composition is preferably 0.50 mass % or less, more preferably 0.30 mass % or less, and further preferably 0.15 mass % or less.

<A4> The polishing composition according to any one of <A1> to <A3>, wherein a content of the compound in the polishing composition is preferably in a range from 0.001 to 0.50 mass %, more preferably in a range from 0.005 to 0.30 mass %, further preferably in a range from 0.01 to 0.15 mass %, and still further preferably in a range from 0.05 to 0.15 mass %.

<A5> The polishing composition according to any one of <A1> to <A4>, wherein the compound is sulfamic acid or aminomethylphosphonic acid.

<A6> The polishing composition according to any one of <A1> to <A5>, wherein a ratio of the number of moles of the sulfonic and/or phosphonic acid group to a total surface area of the cerium oxide particle ([the number of moles of the sulfonic and/or phosphonic acid group]/[total surface area of the cerium oxide particle]) is preferably $1.6 \times 10^{-5}$ mol/m² or more, more preferably $5.1 \times 10^{-5}$ mol/m² or more, further preferably $8.4 \times 10^{-5}$ mol/m² or more, and still further preferably $1.6 \times 10^{-4}$ mol/m² or more.

<A7> The polishing composition according to any one of <A1> to <A6>, wherein a ratio of the number of moles of the sulfonic and/or phosphonic acid group to a total surface area of the cerium oxide particle ([the number of moles of the sulfonic and/or phosphonic acid group]/[total surface area of the cerium oxide particle]) is preferably $5.0 \times 10^{-2}$ mol/m² or less, more preferably $1.4 \times 10^{-3}$ mol/m² or less, further preferably $8.6 \times 10^{-4}$ mol/m² or less, and still further preferably $5.2 \times 10^{-4}$ mol/m² or less.

<A8> The polishing composition according to any one of <A1> to <A7>, wherein a ratio of the number of moles of the sulfonic and/or phosphonic acid group to a total surface area of the cerium oxide particle ([the number of moles of the sulfonic and/or phosphonic acid group]/[total surface area of the cerium oxide particle]) is preferably in a range from $1.6 \times 10^{-5}$ mol/m² to $5.0 \times 10^{-2}$ mol/m², more preferably in a range from $5.1 \times 10^{-5}$ mol/m² to $1.4 \times 10^{-3}$ mol/m², further preferably in a range from $8.4 \times 10^{-5}$ mol/m² to $8.6 \times 10^{-4}$ mol/m², and still further preferably in a range from $1.6 \times 10^{-4}$ mol/m² to $5.2 \times 10^{-4}$ mol/m².

<A9> The polishing composition according to any one of <A1> to <A8>, wherein an average primary particle diameter of the cerium oxide particle calculated by a BET (nitrogen adsorption) method is preferably 15 nm or more, more preferably 20 nm or more, further preferably 40 nm or more, and still further preferably 50 nm or more.

<A10> The polishing composition according to any one of <A1> to <A9>, wherein an average primary particle diameter of the cerium oxide particle calculated by a BET (nitrogen adsorption) method is preferably 300 nm or less, more preferably 200 nm or less, further preferably 150 nm or less, and still further preferably 100 nm or less.

<A11> The polishing composition according to any one of <A1> to <A10>, wherein a content of the cerium oxide particle in the polishing composition is preferably 0.001 mass % or more, more preferably 0.01 mass % or more, further preferably 0.05 mass % or more, and still further preferably 0.1 mass % or more.

<A12> The polishing composition according to any one of <A1> to <A11>, wherein a content of the cerium oxide particle in the polishing composition is preferably 1.0 mass % or less, more preferably 0.80 mass % or less, further preferably 0.60 mass % or less, and still further preferably 0.5 mass % or less.

<A13> The polishing composition according to any one of <A1> to <A12>, wherein a content of the cerium oxide particle in the polishing composition is preferably in a range from 0.001 to 1.0 mass %, more preferably in a range from 0.01 to 0.80 mass %, further preferably in a range from 0.05 to 0.60 mass %, and still further preferably in a range from 0.1 to 0.5 mass %.

<A14> The polishing composition according to any one of <A1> to <A13>, wherein a pH of the polishing composition is preferably more than 2.5, more preferably 3.0 or more, further preferably 3.5 or more, and still further preferably 4.0 or more.

<A15> The polishing composition according to any one of <A1> to <A14>, wherein a pH of the polishing composition is preferably 8.0 or less, further preferably 7.5 or less, and still further preferably 7.0 or less.

<A16> The polishing composition according to any one of <A1> to <A15>, wherein a pH of the polishing composition is preferably more than 2.5 and 8.0 or less, more preferably in a range from 3.0 to 8.0, further preferably in a range from 3.5 to 7.5, and still further preferably in a range from 4.0 to 7.0.

<A17> A method for producing a semiconductor substrate, including polishing a silicon oxide film using the polishing composition according to any one of <A1> to <A16>.

The present invention further relates to the following one or more embodiments.

<B1> A polishing composition for a silicon oxide film, containing:
water;
a cerium oxide particle; and
a compound having an amino group and at least one acid group selected from a sulfonic acid group and a phosphonic acid group in its molecule,
wherein a ratio of the number of moles of the acid group contained in the compound to a total surface area of the cerium oxide particle ([the number of moles of the acid group contained in the compound]/[total surface area of the cerium oxide particle]) is in a range from $1.6 \times 10^{-5}$ mol/m$^2$ to $5.0 \times 10^{-2}$ mol/m$^2$.

<B2> The polishing composition according to <B1>, wherein a content of the compound in the polishing composition is preferably 0.001 mass % or more, more preferably 0.005 mass % or more, further preferably 0.01 mass % or more, and still further preferably 0.05 mass % or more.

<B3> The polishing composition according to <B1> or <B2>, wherein a content of the compound in the polishing composition is preferably 0.50 mass % or less, more preferably 0.30 mass % or less, and further preferably 0.15 mass % or less.

<B4> The polishing composition according to any one of <B1> to <B3>, wherein a content of the compound in the polishing composition is preferably in a range from 0.001 to 0.50 mass %, more preferably in a range from 0.005 to 0.30 mass %, further preferably in a range from 0.01 to 0.15 mass %, and still further preferably in a range from 0.05 to 0.15 mass %.

<B5> The polishing composition according to any one of <B1> to <B4>, wherein the compound is sulfamic acid or aminomethylphosphonic acid.

<B6> The polishing composition according to any one of <B1> to <B5>, wherein a ratio of the number of moles of the acid group contained in the compound to a total surface area of the cerium oxide particle ([the number of moles of the acid group contained in the compound]/[total surface area of the cerium oxide particle]) is preferably $1.6 \times 10^{-5}$ mol/m$^2$ or more, more preferably $5.1 \times 10^{-5}$ mol/m$^2$ or more, further preferably $8.4 \times 10^{-5}$ mol/m$^2$ or more, and still further preferably $1.6 \times 10^{-4}$ mol/m$^2$ or more.

<B7> The polishing composition according to any one of <B1> to <B6>, wherein a ratio of the number of moles of the acid group contained in the compound to a total surface area of the cerium oxide particle ([the number of moles of the acid group contained in the compound]/[total surface area of the cerium oxide particle]) is preferably $5.0 \times 10^{-2}$ mol/m$^2$ or less, more preferably $1.4 \times 10^{-3}$ mol/m$^2$ or less, further preferably $8.6 \times 10^{-4}$ mol/m$^2$ or less, and still further preferably $5.2 \times 10^{-4}$ mol/m$^2$ or less.

<B8> The polishing composition according to any one of <B1> to <B7>, wherein a ratio of the number of moles of the acid group contained in the compound to a total surface area of the cerium oxide particle ([the number of moles of the acid group contained in the compound]/[total surface area of the cerium oxide particle]) is preferably in a range from $1.6 \times 10^{-5}$ mol/m$^2$ to $5.0 \times 10^{-2}$ mol/m$^2$, more preferably in a range from $5.1 \times 10^{-5}$ mol/m$^2$ to $1.4 \times 10^{-3}$ mol/m$^2$, further preferably in a range from $8.4 \times 10^{-5}$ mol/m$^2$ to $8.6 \times 10^{-4}$ mol/m$^2$, and still further preferably in a range from $1.6 \times 10^{-4}$ mol/m$^2$ to $5.2 \times 10^{-4}$ mol/m$^2$.

<B9> The polishing composition according to any one of <B1> to <B8>, wherein an average primary particle diameter of the cerium oxide particle calculated by a BET (nitrogen adsorption) method is preferably 15 nm or more, more preferably 20 nm or more, further preferably 40 nm or more, and still further preferably 50 nm or more.

<B10> The polishing composition according to any one of <B1> to <B9>, wherein an average primary particle diameter of the cerium oxide particle calculated by a BET (nitrogen adsorption) method is preferably 300 nm or less, more preferably 200 nm or less, further preferably 150 nm or less, and still further preferably 100 nm or less.

<B11> The polishing composition according to any one of <B1> to <B10>, wherein a content of the cerium oxide particle in the polishing composition is preferably 0.001 mass % or more, more preferably 0.01 mass % or more, further preferably 0.05 mass % or more, and still further preferably 0.1 mass % or more.

<B12> The polishing composition according to any one of <B1> to <B11>, wherein a content of the cerium oxide particle in the polishing composition is preferably 1.0 mass % or less, more preferably 0.80 mass % or less, further preferably 0.60 mass % or less, and still further preferably 0.5 mass % or less.

<B13> The polishing composition according to any one of <B1> to <B12>, wherein a content of the cerium oxide particle in the polishing composition is preferably in a range from 0.001 to 1.0 mass %, more preferably in a range from 0.01 to 0.80 mass %, further preferably in a range from 0.05 to 0.60 mass %, and still further preferably in a range from 0.1 to 0.5 mass %.

<B14> The polishing composition according to any one of <B1> to <B13>, wherein a pH of the polishing composition is preferably more than 2.5, more preferably 3.0 or more, further preferably 3.5 or more, and still further preferably 4.0 or more.

<B15> The polishing composition according to any one of <B1> to <B14>, wherein a pH of the polishing composition is preferably 8.0 or less, further preferably 7.5 or less, and still further preferably 7.0 or less.

<B16> The polishing composition according to any one of <B1> to <B15>, wherein a pH of the polishing composition is preferably more than 2.5 and 8.0 or less, more preferably in a range from 3.0 to 8.0, further preferably in a range from 3.5 to 7.5, and still further preferably in a range from 4.0 to 7.0.

<B17> A method for producing a semiconductor substrate, including polishing a silicon oxide film using the polishing composition according to any one of <B1> to <B16>.

<B18> A use of a composition in polishing a silicon oxide film, the composition containing:
water;
a cerium oxide particle; and
a compound having in its molecule an amino group and at least one acid group selected from a sulfonic acid group and a phosphonic acid group,
wherein a ratio of the number of moles of the acid group contained in the compound to a total surface area of the cerium oxide particle ([the number of moles of the acid group contained in the compound]/[total surface area of the cerium oxide particle]) is in a range from $1.6 \times 10^{-5}$ mol/m$^2$ to $5.0 \times 10^{-2}$ mol/m$^2$.

<B19> A method for polishing a semiconductor substrate, including polishing a silicon oxide film using the polishing composition according to any one of <B1> to <B16>.

EXAMPLES

1. Preparation of Polishing Composition

Water, an abrasive grain (ceria particle), and sulfamic acid or aminomethylphosphonic acid were mixed in the proportion of Table 1 below, and thereby each polishing composition was obtained. The pH of the polishing composition was adjusted using 1N hydrochloric acid aqueous solution.

Colloidal ceria (BET equivalent particle diameter 69 nm, BET specific surface area 12.1 m$^2$/g) and baked pulverized ceria (BET equivalent particle diameter 70 nm, BET specific surface area 11.8 m$^2$/g) were used as ceria particles.

The pH of the polishing composition, the BET equivalent particle diameter of the ceria particle, and the BET specific surface area of the ceria particle were measured by the following methods.

(a) pH Measurement of Polishing Composition

The pH value of the polishing composition at 25° C. was measured using a pH meter (HM-30G, DKK-TOA CORPORATION) and was read on the pH meter one minute after dipping an electrode into the polishing composition.

(b) BET Equivalent Particle Diameter of Ceria Particle

The BET equivalent particle diameter (nm) of the ceria particle was calculated using a specific surface area S (m$^2$/g) obtained by the following BET (nitrogen adsorption) method, with a specific gravity of the ceria particle set as 7.2 g/cm$^3$.

(c) Method for Measuring BET Specific Surface Area of Ceria Particle

A ceria particle dispersion liquid was dried by hot air at 120° C. for three hours and the resultant was pulverized in an agate mortar, and thereby a sample was obtained. The sample thus obtained was dried in an atmosphere at 120° C. for 15 minutes immediately before measuring the specific surface area. Then, the specific surface area S (m$^2$/g) was measured by the nitrogen adsorption (BET) method using a specific surface area measuring device (Micromeritics Automatic Specific Surface Area Analyzer, FlowSorb III 2305 manufactured by Shimadzu Corporation).

2. Evaluation of Polishing Compositions (Examples 1-18, Comparative Examples 1-3, Reference Examples 1-2)

[Production of Specimen]

An oxide film test specimen was obtained by cutting out a 40 mm×40 mm square piece from a 2000-nm-thick silicon oxide film (oxide film) formed on one side of a silicon wafer by a TEOS-plasma CVD method.

[Measurement of Polishing Speed for Oxide Film]

"MA-300" manufactured by Musashino Denshi Co., Ltd. (platen diameter: 300 mm) was used as a polishing device. A rigid urethane pad "IC-1000/Sub400" manufactured by Nitta Haas Incorporated was used as a polishing pad. The polishing pad was attached onto the platen of the polishing device. The test specimen was set in a holder, and the holder was placed on the polishing pad so that the surface of the test specimen on which a silicon oxide film was formed would face downward (so that the oxide film would face the polishing pad). Further, a weight was placed on the holder so that a load applied to the test specimen would be 300 g weight/cm$^2$. The oxide film test specimen was polished by rotating both of the platen and the holder in the same rotation direction at 90 r/min for two minutes while dropping the polishing composition onto the center of the platen, on which the polishing pad was attached, at a speed of 50 mL/min. After polishing, the oxide film test specimen was washed with ultrapure water and dried, followed by measurement using a spectroscopic reflectometer described below.

The thicknesses of the oxide film before and after polishing were measured using a spectroscopic reflectometer ("Lambda Ace VM-1000" manufactured by SCREEN Semiconductor Solutions Co., Ltd.). The polishing speed for the oxide film was calculated from the formula below. Table 1 below shows the polishing speed for the oxide film, and the speed ratio relative to the polishing speed in Comparative Example 1, 2 or 3 in which neither sulfamic acid nor aminomethylphosphonic acid was used.

Polishing speed for oxide film (Å/min)=[Thickness of oxide film before polishing (Å)−Thickness of oxide film after polishing (Å)]/Polishing time (min)

TABLE 1

| | Particle | Particle concentration [mass %] | Sulfamic acid concentration [mass %] | pH | Acid/Particle mass ratio | Acid group/ Particle surface area [mol/m$^2$] | Polishing speed [Å/min] | Speed ratio relative to polishing composition without acid (0%) |
|---|---|---|---|---|---|---|---|---|
| Com. Ex. 1 | Colloidal ceria | 0.5 | 0.00 | 4.5 | 0 | 0.0E+00 | 1,799 | 1.0 |
| Ex. 1 | Colloidal ceria | 0.5 | 0.05 | 4.5 | 0.1 | 8.5E−05 | 2,656 | 1.5 |
| Ex. 2 | Colloidal ceria | 0.5 | 0.10 | 4.5 | 0.2 | 1.7E−04 | 4,451 | 2.5 |
| Ex. 3 | Colloidal ceria | 0.5 | 0.15 | 4.5 | 0.3 | 2.6E−04 | 3,826 | 2.1 |
| Ex. 4 | Colloidal ceria | 0.5 | 0.30 | 4.5 | 0.6 | 5.1E−04 | 3,886 | 2.2 |
| Ref. Ex. 1 | Colloidal ceria | 0.5 | 0.10 | 2.5 | 0.2 | 1.7E−04 | 872 | 0.5 |
| Ex. 5 | Colloidal ceria | 0.5 | 0.10 | 3.5 | 0.2 | 1.7E−04 | 2,202 | 1.2 |
| Ex. 2 | Colloidal ceria | 0.5 | 0.10 | 4.5 | 0.2 | 1.7E−04 | 4,451 | 2.5 |
| Ex. 6 | Colloidal ceria | 0.5 | 0.10 | 5.5 | 0.2 | 1.7E−04 | 4,948 | 2.8 |
| Ex. 7 | Colloidal ceria | 0.5 | 0.10 | 6.5 | 0.2 | 1.7E−04 | 3,006 | 1.7 |
| Ex. 8 | Colloidal ceria | 0.5 | 0.10 | 7.5 | 0.2 | 1.7E−04 | 2,400 | 1.3 |
| Ref. Ex. 2 | Colloidal ceria | 0.5 | 0.10 | 8.5 | 0.2 | 1.7E−04 | 486 | 0.3 |
| Com. Ex. 2 | Colloidal ceria | 0.1 | 0 | 4.5 | 0 | 0.0E+00 | 1,417 | 1.0 |

TABLE 1-continued

| | Particle | Particle concentration [mass %] | | pH | Acid/Particle mass ratio | Acid group/Particle surface area [mol/m²] | Polishing speed [Å/min] | Speed ratio relative to polishing composition without acid (0%) |
|---|---|---|---|---|---|---|---|---|
| Ex. 9 | Colloidal ceria | 0.1 | 0.01 | 4.5 | 0.1 | 8.5E−05 | 3,162 | 2.2 |
| Ex. 10 | Colloidal ceria | 0.1 | 0.03 | 4.5 | 0.3 | 2.6E−04 | 3,408 | 2.4 |
| Ex. 11 | Colloidal ceria | 0.1 | 0.05 | 4.5 | 0.5 | 4.3E−04 | 3,347 | 2.4 |
| Ex. 12 | Colloidal ceria | 0.1 | 0.10 | 4.5 | 1 | 8.5E−04 | 3,285 | 2.3 |
| Ex. 13 | Colloidal ceria | 0.1 | 0.15 | 4.5 | 1.5 | 1.3E−03 | 3,164 | 2.2 |
| Ex. 14 | Colloidal ceria | 0.1 | 0.3 | 4.5 | 3 | 2.6E−03 | 2,171 | 1.5 |
| Com. Ex. 3 | Baked pulverized ceria | 0.5 | 0 | 6.0 | 0 | 0.0E+00 | 6,961 | 1.0 |
| Ex. 15 | Baked pulverized ceria | 0.5 | 0.01 | 6.0 | 0.02 | 1.7E−05 | 9,139 | 1.3 |
| Ex. 16 | Baked pulverized ceria | 0.5 | 0.03 | 6.0 | 0.06 | 5.2E−05 | 8,114 | 1.2 |
| Ex. 17 | Baked pulverized ceria | 0.5 | 0.05 | 6.0 | 0.1 | 8.7E−05 | 8,381 | 1.2 |
| | | | Aminomethyl phosphonic acid concentration [mass %] | | | | | |
| Com. Ex. 1 | Colloidal ceria | 0.5 | 0.00 | 4.5 | 0 | 0.0E+00 | 1,799 | 1.0 |
| Ex. 18 | Colloidal ceria | 0.5 | 0.15 | 4.5 | 0.3 | 2.2E−04 | 3,810 | 2.1 |

* Ex.: Example,
Com. Ex.: Comparative Example,
Ref. Ex: Reference Example

As shown in Table 1, Examples 1-8 in which colloidal ceria particles and sulfamic acid were used in combination resulted in a higher polishing speed than Comparative Example 1 in which sulfamic acid was not used. Similarly, Examples 9-14 in which colloidal ceria particles and sulfamic acid were used in combination resulted in a higher polishing speed than Comparative Example 2 in which sulfamic acid was not used. Further, Examples 15-17 in which baked pulverized ceria particles and sulfamic acid were used in combination resulted in a higher polishing speed than Comparative Example 3 in which sulfamic acid was not used. Moreover, Example 18 in which colloidal ceria particles and aminomethylphosphonic acid were used in combination resulted in a higher polishing speed than Comparative Example 1 in which aminomethylphosphonic acid was not used.

INDUSTRIAL APPLICABILITY

As explained above, in one or more embodiments, the polishing composition of the present disclosure is useful in a method for producing a high density or high integration semiconductor substrate.

The invention claimed is:

1. A polishing composition for a silicon oxide film, comprising:
   water;
   a cerium oxide particle; and
   a compound having in its molecule an amino group and a phosphonic acid group,
   wherein a ratio of the number of moles of the acid group contained in a specific volume of the compound to a total surface area of the cerium oxide particle ([the number of moles of the acid group contained in the compound]/[total surface area of the cerium oxide particle]) is in a range from $1.6 \times 10^{-5}$ mol/m² to $5.0 \times 10^{-2}$ mol/m²,
   wherein a pH of the polishing composition is in a range from 3.0 to 8.0, and
   wherein the compound is aminomethylphosphonic acid.

2. The polishing composition according to claim 1, wherein an average primary particle diameter of the cerium oxide particle calculated by a BET method is in a range from 15 nm to 300 nm.

3. The polishing composition according to claim 1, wherein a content of the cerium oxide particle in the polishing composition is in a range from 0.001 mass % to 1 mass %.

4. The polishing composition according to claim 1, wherein a content of the compound in the polishing composition is in a range from 0.001 mass % to 0.15 mass %.

5. A method for producing a semiconductor substrate, comprising forming a film consisting of silicon oxide on a silicon wafer and polishing the silicon oxide film using a polishing composition,
   the polishing composition for a silicon oxide film, comprising:
   water;
   a cerium oxide particle; and
   a compound having in its molecule an amino group and a phosphonic acid group,
   wherein a ratio of the number of moles of the acid group contained in a specific volume of the compound to a total surface area of the cerium oxide particle ([the number of moles of the acid group contained in the compound]/[total surface area of the cerium oxide particle]) is in a range from $1.6 \times 10^{-5}$ mol/m² to $5.0 \times 10^{-2}$ mol/m²,
   wherein a pH of the polishing composition is in a range from 3.0 to 8.0, and
   wherein the compound is aminomethylphosphonic acid.

6. A method for polishing a semiconductor substrate, comprising polishing a film consisting of silicon oxide film using a polishing composition, the polishing composition for a silicon oxide film, comprising:

water;

a cerium oxide particle; and a compound having in its molecule an amino group and a phosphonic acid group, wherein a ratio of the number of moles of the acid group contained in a specific volume of the compound to a total surface area of the cerium oxide particle ([the number of moles of the acid group contained in the compound]/[total surface area of the cerium oxide particle]) is in a range from $1.6 \times 10^{-5}$ mol/m$^2$ to $5.0 \times 10^{-2}$ mol/m$^2$, wherein a pH of the polishing composition is in a range from 3.0 to 8.0, and wherein the compound is aminomethylphosphonic acid.

* * * * *